(12) United States Patent
Koscielnik et al.

(10) Patent No.: US 7,948,413 B2
(45) Date of Patent: May 24, 2011

(54) METHOD AND APPARATUS FOR ANALOG-TO-DIGITAL CONVERSION USING ASYNCHRONOUS SIGMA-DELTA MODULATION

(75) Inventors: Dariusz Koscielnik, Crakow (PL); Marek Miskowicz, Crakow (PL)

(73) Assignee: Akademia Gorniczo-Hutnicza Im. Stanislawa Staszica, Cracow (PL)

( * ) Notice: Subject to any disclaimer, the term of this patent is extended or adjusted under 35 U.S.C. 154(b) by 0 days.

(21) Appl. No.: 12/532,884

(22) PCT Filed: Apr. 3, 2008

(86) PCT No.: PCT/PL2008/050006
§ 371 (c)(1),
(2), (4) Date: Mar. 11, 2010

(87) PCT Pub. No.: WO2008/123786
PCT Pub. Date: Oct. 16, 2008

(65) Prior Publication Data
US 2010/0194613 A1    Aug. 5, 2010

(30) Foreign Application Priority Data

Apr. 5, 2007 (PL) .......................................... 382152
Feb. 26, 2008 (PL) .......................................... 384548

(51) Int. Cl.
*H03M 3/00* (2006.01)

(52) U.S. Cl. ....................................... 341/143; 375/326
(58) Field of Classification Search ........... 341/143–155
See application file for complete search history.

(56) References Cited

U.S. PATENT DOCUMENTS

| 7,403,144 | B1 * | 7/2008 | Cruz-Albrecht et al. ..... 341/143 |
| 7,633,420 | B2 * | 12/2009 | DuPuis ......................... 341/143 |
| 7,777,656 | B2 * | 8/2010 | Hernandez et al. ........... 341/143 |
| 2005/0190865 | A1 | 9/2005 | Lazar et al. |

* cited by examiner

*Primary Examiner* — Lam T Mai
(74) *Attorney, Agent, or Firm* — Dennison, Schultz & MacDonald

(57) ABSTRACT

Analog to digital conversion characterized in that the square wave (z(t)) obtained as a result of modulation in an asynchronous Sigma-Delta modulator (ASDM) is subjected to conversion by counting the periods ($T_0$) of the reference clock (RG) during subsequent pulses of the square wave by means of the counting module (CTM), and then each word obtained representing the number of periods of the reference clock counted during each given pulse of the square wave is recorded and stored in the intermediate buffer (TBUF). The duration of the serial transmission of the digital word obtained as a result of counting the periods of the reference clock during previous pulse of the square wave is simultaneously controlled by the control module (CM), and as soon as this transmission is completed, the content of the intermediate buffer (TBUF) is transferred to the transmitting buffer (TDR) of the apparatus.

9 Claims, 8 Drawing Sheets

METHOD AND APPARATUS FOR ANALOG-TO-DIGITAL CONVERSION USING ASYNCHRONOUS SIGMA-DELTA MODULATION

BACKGROUND OF THE INVENTION

The subject of this invention is a method and an apparatus for analog-to-digital conversion using asynchronous Sigma-Delta modulation. The invention can be applied in the field of signal conversion and processing, especially of lowpass signals where the analog signal recovery is required, and also in measurement and control systems.

The method of analog-to-digital conversion using asynchronous Sigma-Delta modulation known from the U.S. Pat. No. 6,087,968 consists in that an analog signal is modulated using an asynchronous Sigma-Delta modulator, and an obtained square wave is sampled with reference frequency in the sampler, and then the obtained signal is subjected to decimation and rate reduction using the digital decimation filter, and the obtained digital signal is arranged in a sequence of digital words, suitable for further transmission or processing.

In the other method of encoding and decoding of a signal known from the patent application US 2005/0190865, the conversion of the analog signal into the square wave consisting in the modulation of the analog signal using the asynchronous Sigma-Delta modulator is shown, and the subsequent analog signal recovery on the basis of the knowledge of time instants, in which the edges of the square wave obtained on the output of the asynchronous Sigma-Delta modulator occur. The time instants of occurrences of successive edges of the square wave are measured with finite precision by the quantization of the width of subsequent pulses and the encoding of the quantization results in the quantizer designed in the form of the counter connected to the reference clock. After completing the quantization of the current pulse, the digital word obtained on the counter output is made available by the transmission to the devices where it undergoes further processing.

The analog-to-digital converter known from the U.S. Pat. No. 6,087,968 comprises the asynchronous Sigma-Delta modulator connected to the sampler that on the other hand is connected to the reference clock. The sampler output is connected to the digital decimation filter, whose output is at the same time an output of the analog-to-digital converter, whereas the asynchronous Sigma-Delta modulator comprises the adder on its input. The adder output, through the integrator, is connected to the hysteresis comparator, and the hysteresis comparator output, which is at the same time the asynchronous Sigma-Delta modulator output, is connected in the feedback loop to the inverted input of the adder.

The other apparatus for signal conversion known from the patent application US 2005/0190865 comprises the asynchronous Sigma-Delta modulator whose output is connected to the input of a counter that on the other hand is coupled to the reference clock. The output of the counter is connected to a processor with which the reference clock is also coupled.

SUMMARY OF THE INVENTION

The method according to the present invention consisting in the modulation of the analog signal using the asynchronous Sigma-Delta modulator, counting periods of the reference clock during each pulse of the previously obtained square wave and making the digital word available, is characterized in that the square wave obtained in result of the asynchronous Sigma-Delta modulation is converted by counting the reference clock periods during subsequent pulses of that square wave by means of the counting module. Further on, each digital word obtained representing the number of periods counted during each given pulse of the square wave is recorded and stored in the intermediate buffer; and the duration of the serial transmission of the digital word obtained in result of counting the reference clock periods during previous pulse of the square wave is simultaneously controlled by the control module; and as soon as this transmission is completed, the content of the intermediate buffer is transferred to the transmitting buffer; and after that a given digital word representing a given pulse of the square wave is transmitted serially to the computer or to the communication network; then the cycle is repeated for the next pulse of the square wave. The counting of the reference clock periods starts from an assumed initial state of the counting module defined by the number whose value is less than or equal to zero. The number representing the assumed initial state of the counting module is negative and its absolute value is the highest integer number less than or equal to the number defined as the ratio of the fourth part of the period of the square wave obtained for the analog signal whose value is constant in time and equal to zero to the reference clock period.

In the other variant of the method according to the present invention, the number representing the assumed initial state of the counting module is negative and its absolute value is the highest integer number less than or equal to the number defined as the difference between the ratio of the fourth part of the period of the square wave obtained for the analog signal whose value is constant in time and equal to zero to the reference clock period, and the number of reference clock ticks in the time interval equal to the sum of the time needed to write the result of each counting to the intermediate buffer and the time needed to introduce the assumed initial state from the setup register to the counting module.

Besides, the serial transmission is carried out via the output port of the transmitting buffer with the rate defined as the ratio of the number of bits of a given word obtained by means of the counting module increased by a number of control bits to the half of the period of the square wave determined for the analog signal whose value is constant in time and equal to zero.

The apparatus according to the present invention comprises the asynchronous Sigma-Delta modulator and the counting module to which the reference clock is connected, is characterized in that the output of the counting module is connected to the intermediate buffer whose output is coupled to the transmitting buffer; the output of the transmitting buffer is at the same time the output of the whole apparatus for the analog-to-digital conversion; and the input programming the initial state of the counting module is connected to the setup register, whereas the counting input of the counting module is connected to the output of the known reference clock. The output of the known reference clock and the output the known asynchronous Sigma-Delta modulator are connected to separate inputs of the control module, whose outputs are connected to the counting module, the intermediate buffer and the transmitting buffer respectively.

In the development of the apparatus according to the present invention, the counting module comprises one counter, whose input programming its initial state is connected directly to the setup register, and its counting input is connected directly to the output of the known reference clock. The output of the counter is connected directly to the intermediate buffer, and the counter input that controls writing the initial state into the counter is connected to the output of the control module.

In the other development of the apparatus according to the present invention, the counting module comprises two counters whose inputs programming their initial states are connected to the setup register, and the counting inputs are connected via the controlled switches to the known reference clock output. The control input of one switch is connected directly to the output of the known asynchronous Sigma-Delta modulator, and the control input of the other switch is connected via an inverter to the output of the known asynchronous Sigma-Delta modulator, to which the input of the control module is coupled at the same time. The output of the counting module connected to the intermediate buffer is the output of the multiplexer whose inputs are connected to the outputs of appropriate counters, and the multiplexer is coupled to an additional output of the control module, while separate outputs of the control module are connected to the inputs that control writing the initial states to the counters.

The solution according to the invention, by applying extra data buffering with the intermediate buffer allows to reduce the transmission bit rate even twice through the serial output port of the conversion apparatus by shortening time intervals between successive digital words transmitted, and to set the transmission bit rate independent of the converted analog signal amplitude. Besides, if the counting starts from the negative initial number, especially for its optimum value, it results in the increase of the resolution of analog-to-digital conversion used. Furthermore, the method and apparatus for analog-to-digital conversion according to the invention is simple, energy efficient, and immune to noise.

BRIEF DESCRIPTION OF THE DRAWINGS

The solution according to the invention is presented in the following drawings.

DESCRIPTION OF THE PREFERRED EMBODIMENTS

The method according to the invention consists in that the analog signal $x(t)$ is modulated using the asynchronous Sigma-Delta modulator ASDM, and then the obtained square wave $z(t)$ is converted by counting periods $T_0$ of the reference clock RG during successive pulses of the square wave $z(t)$ using the counting module CTM. Each digital word obtained representing the counted number of periods $T_0$ of the reference clock RG during each given pulse of the square wave $z(t)$ is recorded and stored in the intermediate buffer TBUF. At the same time the duration of the serial transmission of a digital word obtained in result of counting periods $T_0$ of the reference clock RG during the previous pulse of the square wave $z(t)$ is controlled by the control module CM, and as soon as this transmission is completed, the content of the intermediate buffer TBUF is transferred to the transmitting buffer TDR of the apparatus. Next, a given digital word representing a given pulse of the square wave $z(t)$ is serially transmitted to the computer or to the communication network, and the cycle is repeated for the next pulse of the square wave $z(t)$. The serial transmission is carried out through the output port TxD of the transmitting buffer TDR with the rate defined as the ratio of the number of bits of a given word obtained by means of the counting module CTM, increased by a number of control bits: start bit and stop bit, to the half of the period T of the square wave $z(t)$ determined previously by modulating the analog signal $x(t)$ that is constant in time and equal to zero.

Figure 5:
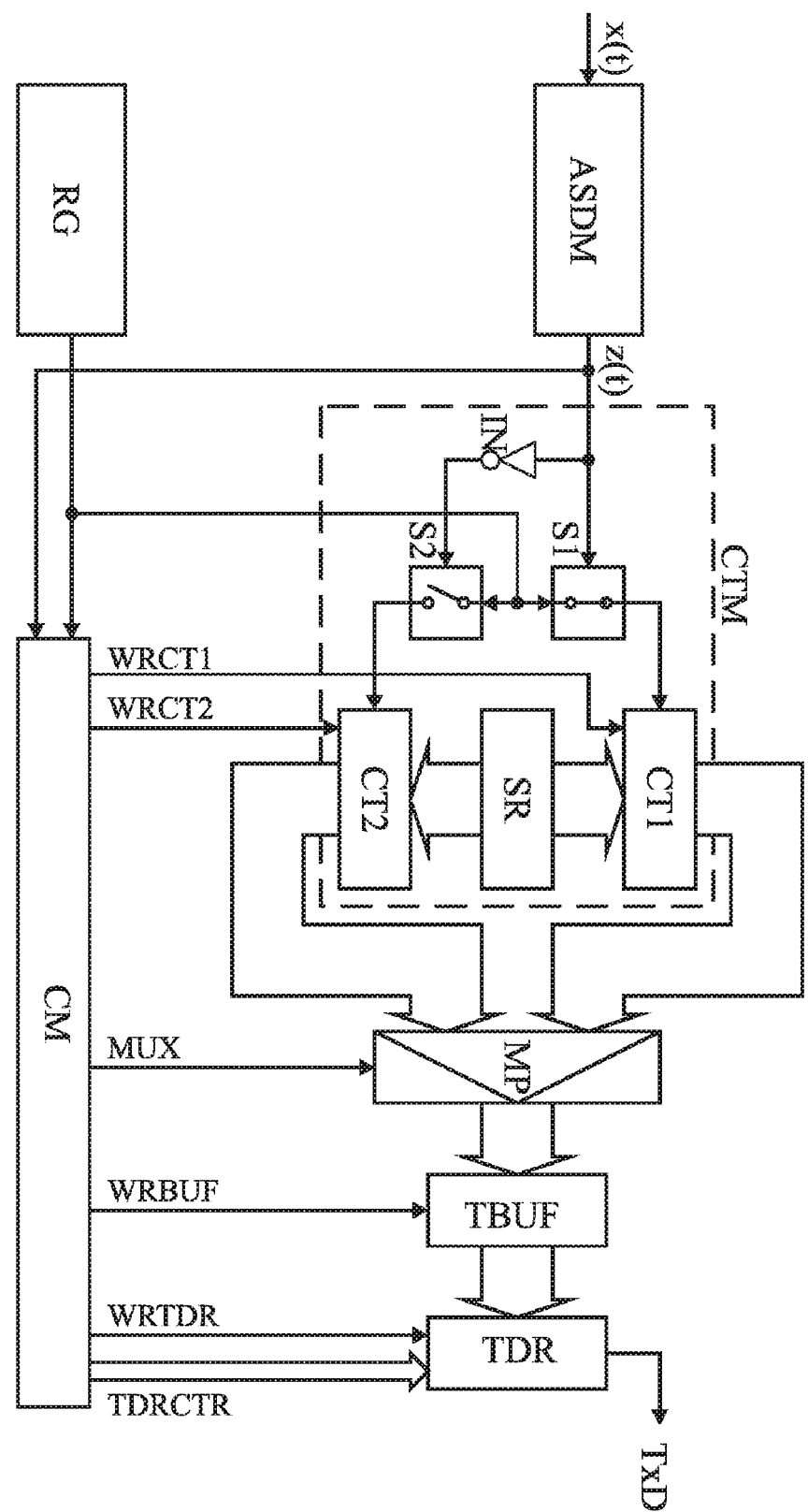
FIG. 5 illustrates the apparatus with the counting module comprising two counters.
Figure 7:
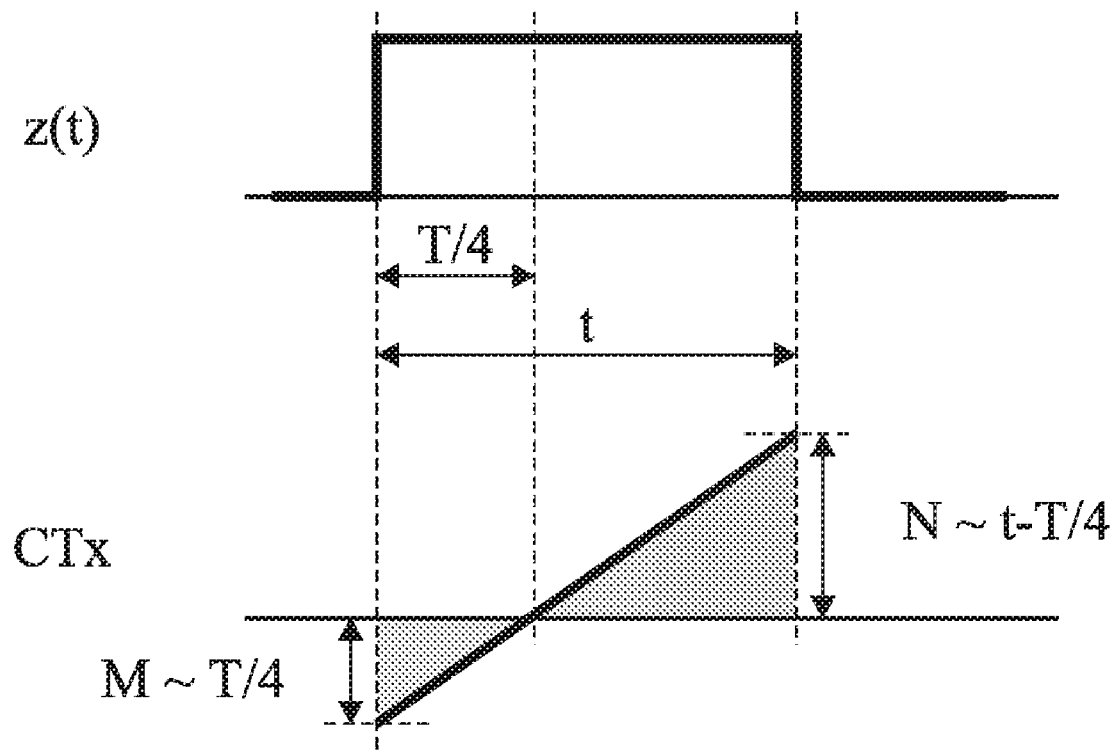
FIG. 7 illustrates the course of counting from the negative initial state in the apparatus according to FIG. 5.

In the variant of the method according to the invention, using the apparatus shown in FIG. 5, the counting of periods $T_0$ of the reference clock RG starts every time from the assumed initial state of the counters CT1, CT2 of the counting module CTM defined by the negative number M (FIG. 7), whose absolute value is the highest integer number less than or equal to the number defined as the ratio of the fourth part of the period of the square wave obtained for the analog signal $x(t)$ that is constant in time and equal to zero to the period $T_0$ of the reference clock RG.

Figure 2:
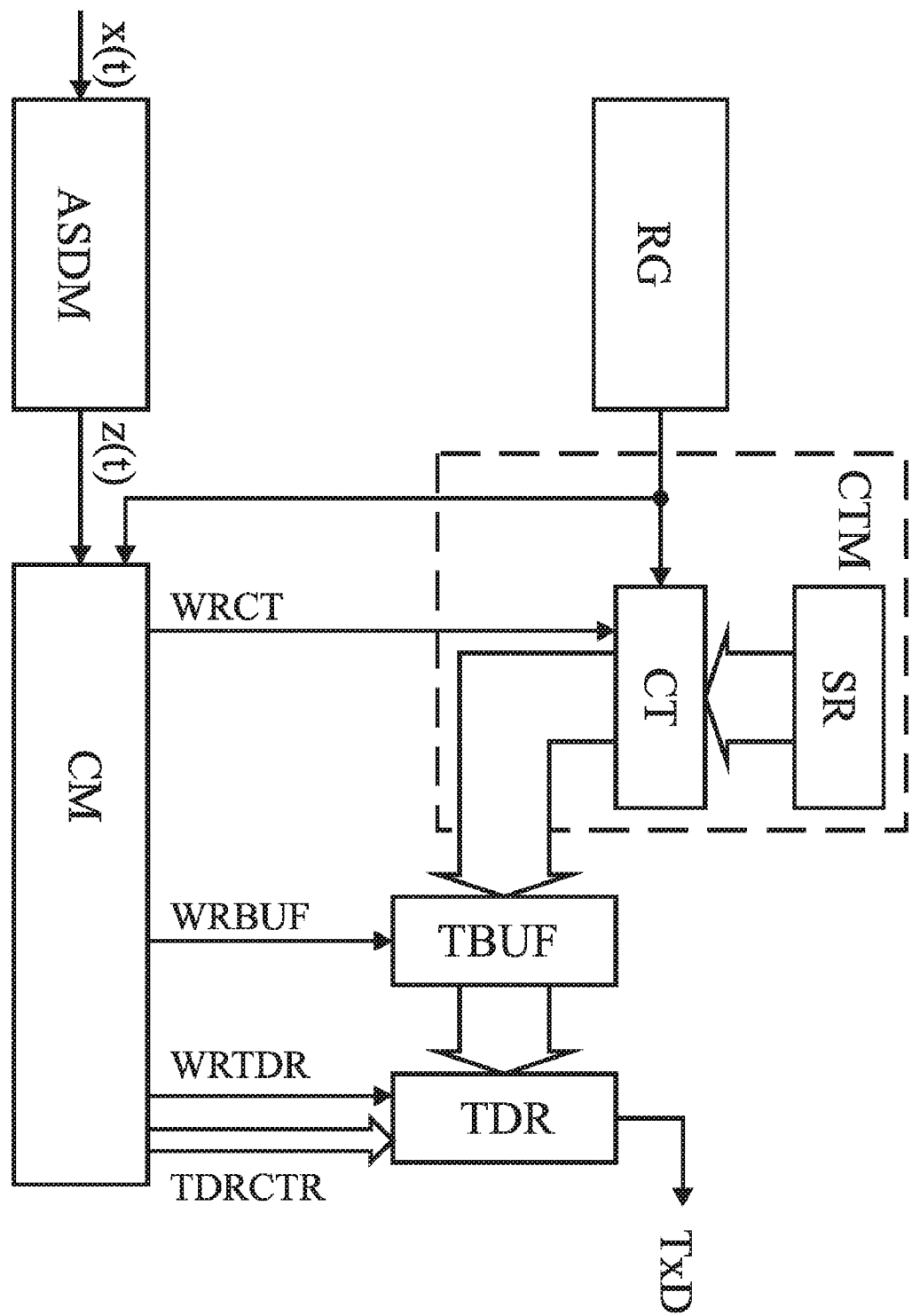
FIG. 2 shows an apparatus with the counting module comprising one counter.
Figure 4:
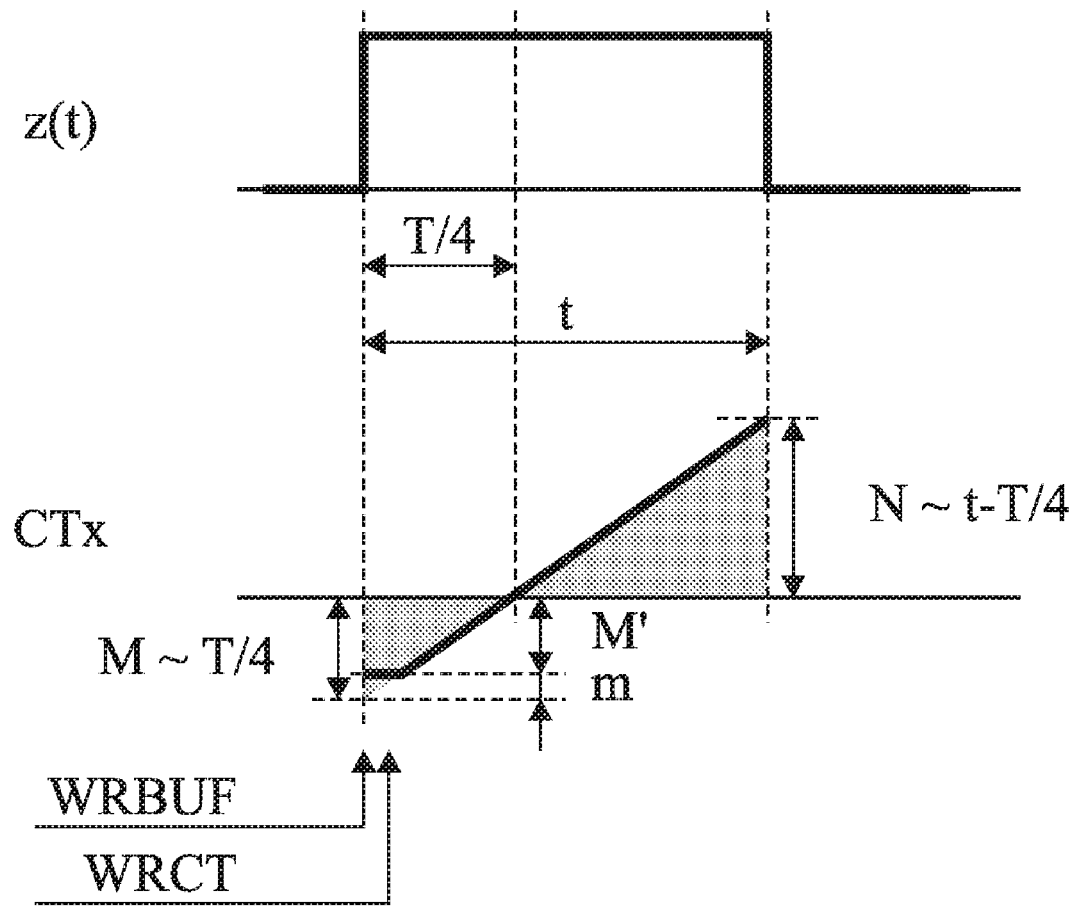
FIG. 4 illustrates the course of counting from the negative initial state in the apparatus according to FIG. 2.

In the other variant of the method, according to the invention, using the apparatus shown in FIG. 2, the counting of periods $T_0$ of the reference clock RG starts every time from the assumed initial state of the counter CT of the counting module CTM defined by the negative number M' (FIG. 4), whose absolute value is the highest integer number less than or equal to the number defined as the difference between the ratio of the fourth part of the period T of the square wave $z(t)$ obtained for the analog signal $x(t)$ that is constant in time and equal to zero to the period $T_0$ of the reference clock RG, and the number m of ticks of the reference clock RG in the time interval equal to the sum of the time needed to write the result of each counting to the intermediate buffer TBUF, and the time needed to introduce the assumed initial state from the setup register SR to the counter CT, and where the counting starts as soon as the previous result of counting is written to the intermediate buffer TBUF and the content of the setup register SR is introduced to the counter CT of the counting module CTM.

Figure 1:
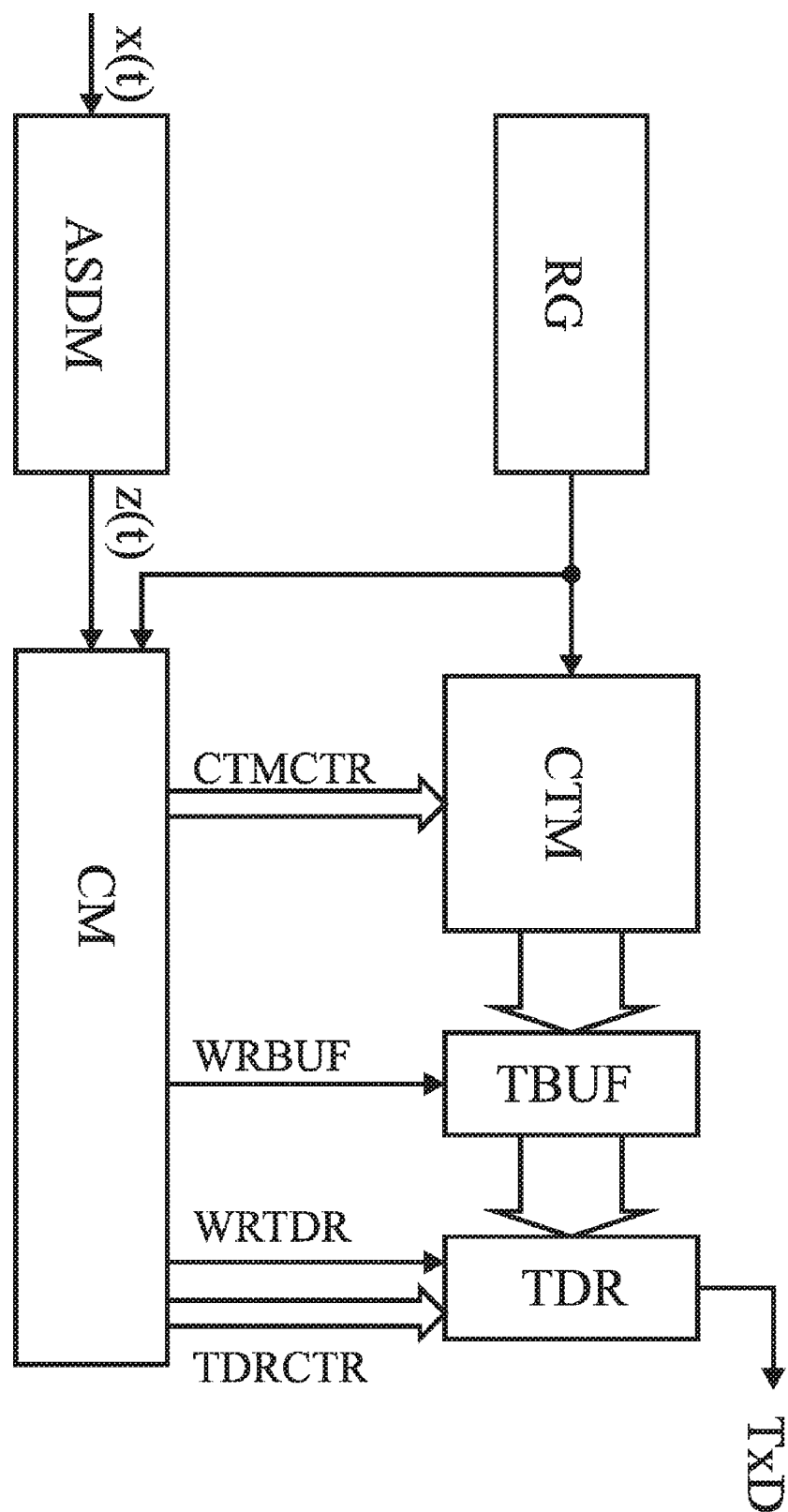
FIG. 1 illustrates a block diagram of the apparatus.

The apparatus according to the invention comprises the asynchronous Sigma-Delta modulator ASDM and the counting module CTM to which the reference clock RG is connected (FIG. 1). The output of the counting module CTM is connected to the intermediate buffer TBUF whose output is coupled to the transmitting buffer TDR. The output of the transmitting buffer TDR is at the same time the output of the whole apparatus for the analog-to-digital conversion. The input programming the initial state of the counting module CTM is connected to the setup register SR, and the counting input of the counting module CTM is connected to the output of the known reference clock RG. The output of the known reference clock RG and the output of the known asynchronous Sigma-Delta modulator ASDM are connected to the separate inputs of the control module CM, whose outputs are connected to the counting module CTM, the intermediate buffer TBUF and the transmitting buffer TDR respectively.

In the embodiment of the invention shown in FIG. 2, the counting module CTM comprises one modulo counter CT whose input programming its initial state is connected to the setup register SR, and the counting input of the counter CT is connected directly to the output of the reference clock RG.

The output of the reference clock RG is connected to one input of the control module CM, while the output of the asynchronous Sigma-Delta modulator ASDM is connected to the other input of the control module CM. On the other hand, the output of the counter CT of the counting module CTM is connected directly to the intermediate buffer TBUF, whose output is connected to the transmitting buffer TDR while the output of the transmitting buffer TDR is at the same time the output of the whole apparatus for the analog-to-digital conversion. The outputs of the control module CM are connected respectively to the control inputs of the intermediate buffer TBUF and the transmitting buffer TDR, and the input that controls the writing of the initial state to the counter CT of the counting module CM.

In the other embodiment of the invention shown in FIG. 5, the counting module CTM comprises two modulo counters CT1, CT2 whose counting inputs are connected through the controlled switches S1, S2 to the output of the known reference clock RG coupled to one input of the control module CM. The control input of the switch 51 is directly connected to the output of the asynchronous Sigma-Delta modulator ASDM, and the control input of the other switch S2 is connected through an inverter IN to the output of the asynchronous Sigma-Delta modulator ASDM, to which the second input of the control module CM is coupled at the same time. The inputs programming the initial states of both counters CT1, CT2 are connected to the setup register SR. The outputs of the counters CT1, CT2 are connected to separate inputs of the multiplexer MP whose output is the output of the counting module CTM and is connected to the input of the intermediate buffer TBUF. The inputs that control the writing of the initial states to the counters CT1, CT2 are connected to separate outputs of the control module CM. The additional output of the control module CM is connected to the multiplexer MP.

The apparatus according to the invention operates as follows. The analog input signal x(t) is modulated in the asynchronous Sigma-Delta modulator ASDM, and the signal z(t) obtained on its output is a square wave with the modulated frequency and duty cycle. The widths of successive pulses of the square wave z(t) on the asynchronous Sigma-Delta modulator ASDM output depend on the amplitude of the analog signal x(t) on its input. Next, the square wave z(t) is converted by counting the periods $T_0$ of the reference clock RG using the counting module CTM during successive pulses of the square wave z(t). In result of counting, the width of each pulse of the square wave z(t) is represented by the integer number of periods $T_0$ of the reference clock RG expressed in the form of a binary digital word of a fixed number of bits. The counting of the periods $T_0$ of the reference clock RG signal is started every time from the assumed initial state. And thus, each edge of the square wave z(t) on the asynchronous Sigma-Delta modulator ASDM output causes the recording of the result of the counting of the reference clock RG periods for the previous pulse of the square wave z(t) in the intermediate buffer TBUF, and writing the assumed initial state from the setup register SR into the counting module CTM.

After writing the initial state into the counting module CTM, the counting of periods $T_0$ of the reference clock RG starts. The counting is completed when the successive edge of the square wave z(t) occurs. All cyclic operations carried out by the counting module CTM are controlled by means of the control signal CTMCTR generated by the control module CM on the basis of the signal z(t) as shown in FIG. 1. Next, a digital word representing the result of counting for a given pulse of the square wave z(t) is recorded in the intermediate buffer TBUF and stored there until the transmission of the previous word is completed. The course of the transmission is controlled by the control module CM by means of the set of control signals TDRCTR comprising a signal clocking the transmission, a signal determining the correct value of control bits in the transmitting buffer TDR, and a signal that stops the shifting of the content of the TDR buffer after the completion of the transmission of the whole word. The completion of the transmission of the previous word triggers the generation of the pulse WRTDR by the control module CM. The leading edge of the WRTDR pulse causes the transfer of a given word from the intermediate buffer TBUF to the transmitting buffer TDR, where after providing it with the bit start and the bit stop, the serial transmission of successive bits of a given word starts on the serial output port TxD of the transmitting buffer TDR.

The serial transmission is carried out with the rate defined as the ratio of the number of bits of a given word obtained by means of the counting module CTM increased by a number of control bits to the half of the period T of the square wave z(t) determined previously by modulating the analog signal x(t) that is constant in time and equal to zero.

In the embodiment of the apparatus according to the invention shown in FIG. 2 in which the counting module CTM comprises one counter CT, each edge of the square wave z(t) on the asynchronous Sigma-Delta modulator ASDM output triggers the generation of the control pulse WRBUF by the control module CM. The control pulse WRBUF causes the recording of the result of the counting of the periods $T_0$ of the reference clock RG for the previous pulse of the square wave z(t) in the intermediate buffer TBUF. The trailing edge of the control pulse WRBUF triggers the generation of the pulse WRCT by the control module CM (FIG. 3) that causes writing the assumed initial state into the counter CT of the counting module CTM. The initial state stored in the setup register SR is defined as the negative number M' (FIG. 4) whose absolute value is less by a number m than the absolute value of the negative number M, where the negative number M is a number whose absolute value is the highest integer number less than or equal to the number defined as the ratio of the fourth part of the period T of the square wave z(t) obtained for the analog signal x(t) whose value is constant in time and equal to zero to the period $T_0$ of the reference clock RG, and m is the number of ticks of the reference clock RG in the time interval equal to the sum of the time needed to write the result of each counting to the intermediate buffer TBUF and the time needed to write the assumed initial state from the setup register SR to the counter CT. After writing the initial state into the counting module CTM, the counting of the periods $T_0$ of the reference clock RG starts. The counting is completed when the successive edge of the square wave z(t) on the output of the asynchronous Sigma-Delta modulator ASDM occurs.

Figure 3:
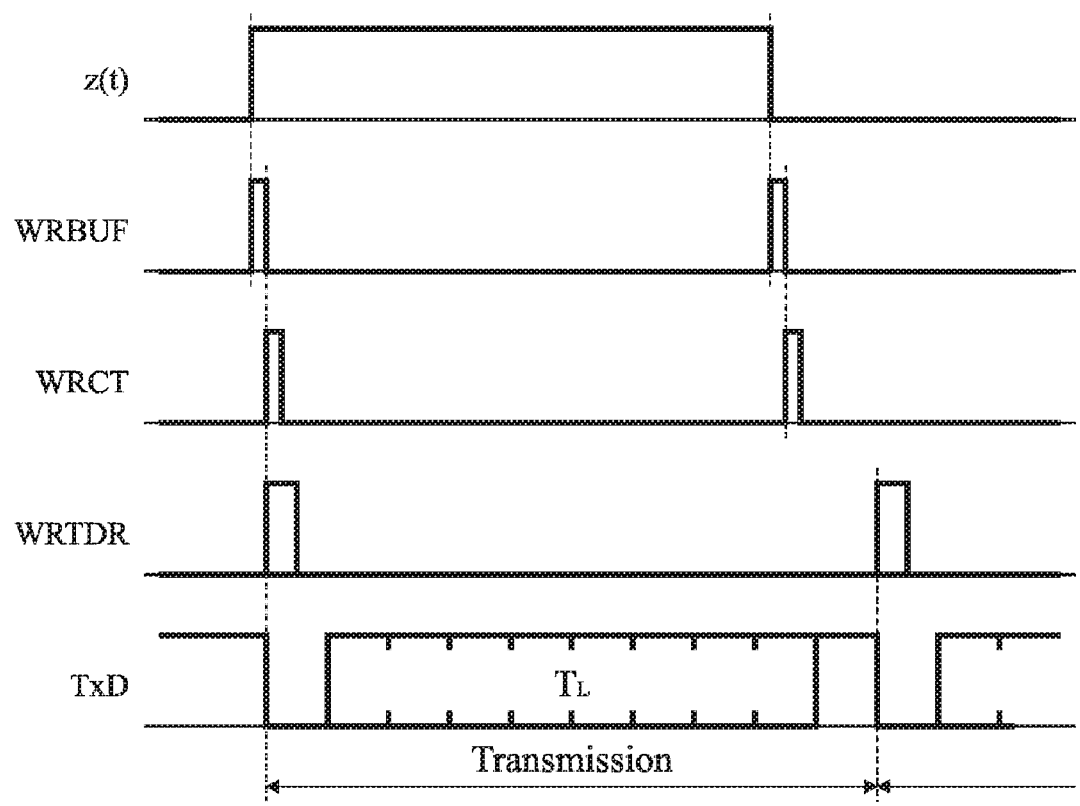
FIG. 3 illustrates timing of control signals in the apparatus according to FIG. 2.

In the embodiment of the apparatus according to the invention shown in FIG. 2 in which the counting module CTM comprises one counter CT, the control of the counting module CTM by the control module CM is carried out by means of the signal CTMCTR (FIG. 1) in the form of a single control signal WRCT (FIG. 2). A digital word recorded in the intermediate buffer TBUF representing the result of counting for a given pulse of the square wave z(t) is stored until the transmission of the previous word is completed. The course of the transmission is controlled by the control module CM by means of the set of control signals TDRCTR comprising a signal clocking the transmission, a signal determining the correct value of control bits in the transmitting buffer TDR, and the signal that stops the shifting of a content of the TDR buffer after the completion of the transmission of the whole word. The completion of the transmission of the previous word triggers the generation of the pulse WRTDR by the control module CM. The leading edge of the WRTDR pulse causes transfer of a given word from the intermediate buffer TBUF to the transmitting buffer TDR, where after providing it with the bit start and the bit stop, the serial transmission of successive bits of a given word starts on the serial output port TxD of the transmitting buffer TDR (FIG. 3).

Figure 6:
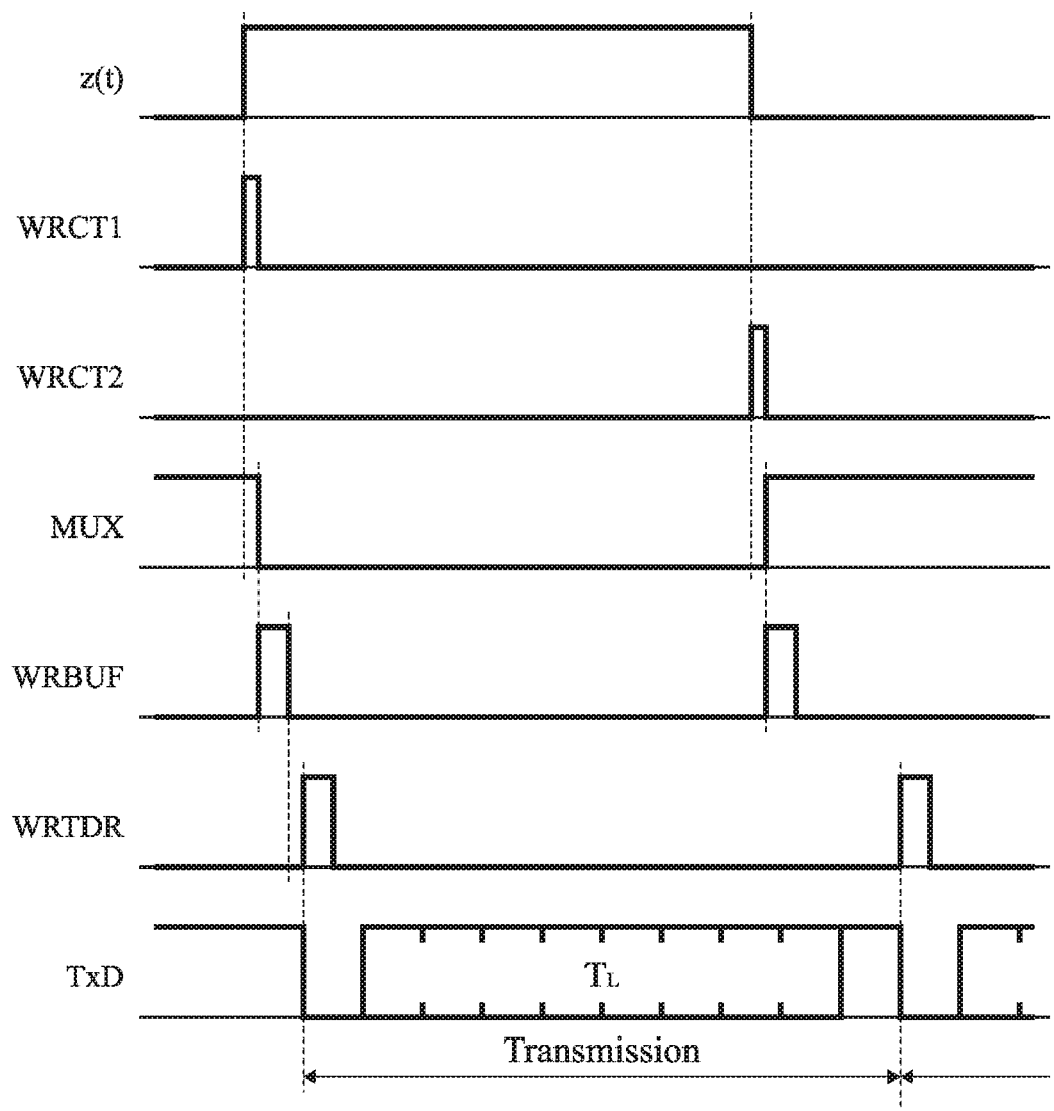
FIG. 6 illustrates timing of control signals in the apparatus according to FIG. 5.

In the embodiment of the apparatus according to the invention shown in FIG. 5 in which the counting module CTM comprises two counters CT1, CT2, the square wave z(t) is converted by counting the periods $T_0$ of the reference clock RG during a given positive pulse of the square wave z(t) by the counter CT1, and during the successive negative pulse of the square wave z(t) by the counter CT2 respectively. In result of counting, the width of each pulse of the square wave z(t) is represented by the integer number of periods $T_0$ of the reference clock RG expressed in the form of a binary digital word of a fixed number of bits. The reference clock RG is supplied to the counters CT1, CT2 through the controlled switches S1, S2 connected alternately by the levels of successive pulses of the square wave z(t) from the modulator ASDM output. Thus, the high level of the square wave z(t) causes the closure of the switch S1 supplying the reference clock RG signal to the counter CT1 and at the same time the opening of the switch S2, while the low level of the square wave z(t) closes the switch S2 connecting the reference clock RG signal to the counter CT2 and at the same time opens the switch S1. The counting of the periods $T_0$ of the reference clock RG signal is started every time from the assumed initial state of the counters CT1, CT2 defined by the number M less than zero (FIG. 7) and stored in the setup register SR. Each rising edge of the square wave z(t) on the asynchronous Sigma-Delta modulator ASDM output writes the content of the setup register SR to the counter CT1 using the signal WRCT1 generated by the control module CM, and each falling edge of the square wave z(t) writes the content of the corresponding setup register SR to the counter CT2 using the signal WRCT2 generated by the control module CM (FIG. 6). The alternative way of determining the initial state for the counters CT1, CT2 can consist in the introducing of the content of the setup register SR as soon as the final result of the previous counting is recorded in the intermediate buffer TBUF. After writing the initial state to the counters CT1, CT2, the counting of periods $T_0$ of the reference clock RG starts. The counting in the counter CT1 is completed when the falling edge of the square wave z(t) appears and the counting in the counter CT2 is completed when the rising edge of the square wave z(t) occurs. Simultaneously, after completing the counting process for a given current pulse of the square wave z(t) by means of the counter CT1 or CT2 respectively, the control module CM selects one of the two inputs of the multiplexer MP using a signal MUX. Each edge of the MUX signal triggers the generation of the short pulse WRBUF by the control module CM. The falling edge of the pulse WRBUF makes a digital word to be written to the intermediate buffer TBUF. The duration of the WRBUF pulse is long enough to establish a stable state of corresponding logical levels on the output of the multiplexer MP. A given word recorded in the intermediate buffer TBUF is stored until the transmission of the previous word is completed.

In the embodiment of the apparatus according to the invention shown in FIG. 5 in which the counting module CTM comprises two counters CT1, CT1, the control of the counting module CTM by the control module CM is carried out by means of the signal CTMCTR (FIG. 1) comprising a set of the control signals WRCT1, WRCT2, MUX and z(t) (FIG. 5). A given word recorded in the intermediate buffer TBUF representing the result of counting for a given pulse of the square wave z(t) is stored until the transmission of the previous word is completed. The course of the transmission is controlled by the control module CM by means of the set of control signals TDRCTR comprising a signal clocking the transmission, a signal determining the correct value of control bits in the transmitting buffer TDR, and the signal that stops the shifting of a content of the TDR buffer after the completion of the transmission of the whole word.

The completion of the transmission of the previous word triggers the generation of the pulse WRTDR by the control module CM. The leading edge of the WRTDR pulse causes the transfer of a given word from the intermediate buffer TBUF to the transmitting buffer TDR, where after providing it with a bit start and a bit stop, the serial transmission of successive bits of a given word starts on the serial output port TxD of the transmitting buffer TDR (FIG. 6).

Figure 8A:
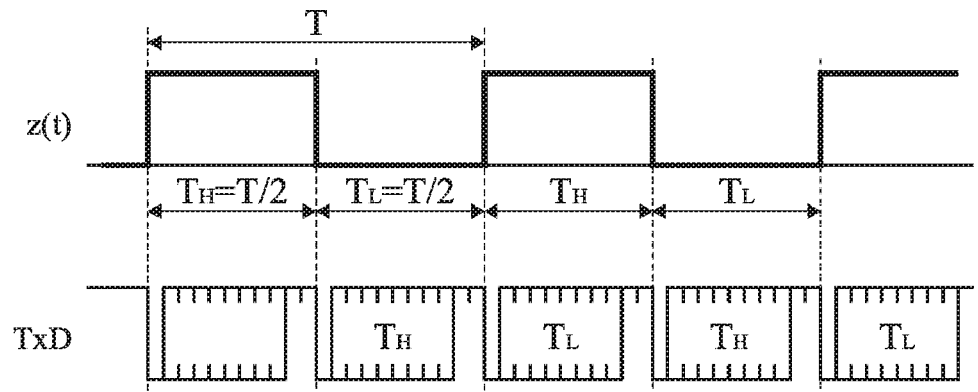
FIG. 8a illustrates output data transmission for analog input signal x(t) equal to zero.

When, in the apparatus according to the invention either from FIG. 1, or in its developments from FIG. 2 and FIG. 5, the square wave z(t) on the output of the asynchronous Sigma-Delta modulator ASDM has duty cycle equal to 0.5, which happens when the ASDM modulator input is driven by the analog signal x(t) of the value constant in time and equal to zero, the process of the transmission of the digital word representing the previous pulse of the square wave z(t) and the process of conversion of the current pulse of this signal z(t) into the digital word do not overlap each other in time (FIG. 8a). Then, the digital words after writing them into the intermediate buffer TBUF are immediately transferred to the transmitting buffer TDR where their serial transmissions via the serial output port TxD of the transmitting buffer TDR start.

Figure 8B:
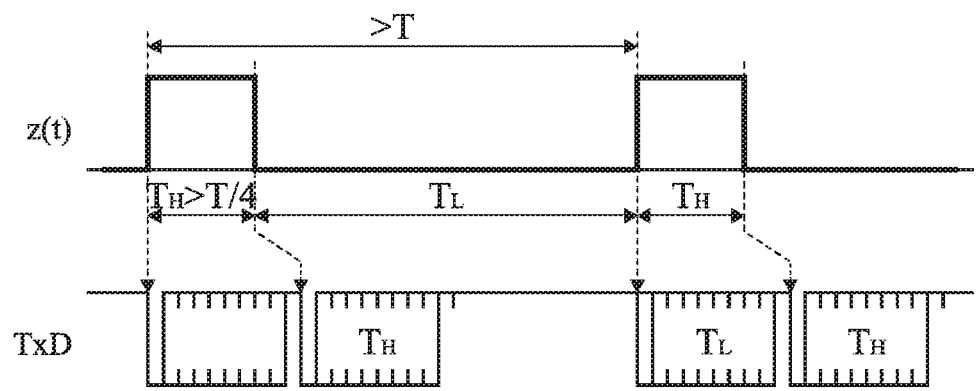
FIG. 8b illustrates output data transmission for a positive level of analog input signal x(t).
Figure 8C:
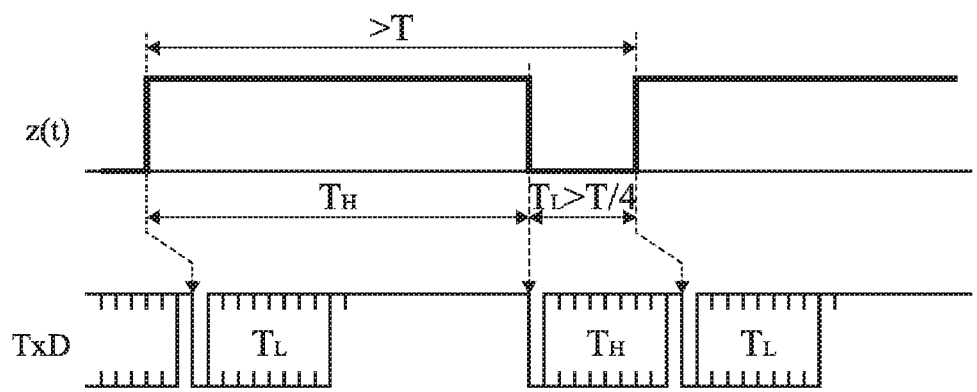
FIG. 8c illustrates output data transmission for a negative level of analog input signal x(t).

When, in the apparatus according to the invention either from FIG. 1, or in its developments from FIG. 2 and FIG. 5, the square wave z(t) on the asynchronous Sigma-Delta modulator ASDM output has duty cycle different from 0.5, which happens when the ASDM modulator input is driven by the analog signal x(t) whose value is different from zero, the process of the transmission of the digital word representing the previous pulse of the square wave z(t) and the process of conversion of the current pulse of this signal z(t) into the digital word overlap each other in time (FIG. 8b, FIG. 8c). Then, the additional data buffering in the intermediate buffer TBUF prevents the loss of data contained in digital words.

ASDM—asynchronous Sigma-Delta modulator
CTM—counting module
TBUF—intermediate buffer
TDR—transmitting buffer
RG—reference clock
CM—control module
CT, CT1, CT2—digital counters
SR—setup register
S1, S2—controlled switches
IN—inverter
x(t)—analog signal on asynchronous Sigma-Delta modulator input
z(t)—square wave on asynchronous Sigma-Delta modulator output
WRCT, WRCT1, WRCT2—control pulses to write initial states to counters CT, CT1, CT2
MUX—control signal for multiplexer input selection
WRBUF—control pulse to write data to the intermediate buffer
WRTDR—control pulse to write data to the transmitting buffer
TDRCTR—set of signals controlling output data transmission
TxD—serial output port $T_0$—reference clock period
T—period of square wave z(t) for analog signal x(t) whose value is constant in time and equal to zero

What is claimed is:
1. Method for analog-to-digital signal conversion with asynchronous Sigma-Delta modulation comprising modulation of an analog signal by means of an asynchronous Sigma-Delta modulator, counting periods of a reference clock during each pulse of a previously obtained square wave and making a digital word available,
wherein the square wave (z(t)) obtained as a result of the modulation in the asynchronous Sigma-Delta modulator (ASDM) undergoes conversion by counting periods of the reference clock (RG) during subsequent pulses of the square wave (z(t)) using a counting module (CTM), and
wherein subsequently, each digital word obtained representing the counted number of periods ($T_0$) of the reference clock (RG) during each given pulse of the square wave (z(t)) is recorded and stored in an intermediate buffer (TBUF), and at the same time, duration of serial transmission of a digital word obtained as a result of counting the periods (T0) of the reference clock (RG) during the previous pulse of the square wave (z(t)) is controlled by a control module (CM), and as soon as this transmission is completed, content of the intermediate buffer (TBUF) is transferred to a transmitting buffer (TDR), and
wherein subsequently, the given digital word representing the given pulse of the square wave (z(t)) is serially transmitted to a computer or to a communication network, and a cycle a described is repeated for the subsequent pulse of the square wave (z(t)).

2. Method as claimed in claim 1, wherein the counting of the periods ($T_0$) of the reference clock (RG) starts from an assumed initial state of the counting module (CTM) defined by a number having a value which is less than zero.

3. Method as claimed in claim 1, wherein the counting of the periods ($T_0$) of the reference clock (RG) start from an assumed initial state of the counting module (CTM) defined by a number having value which is equal to zero.

4. Method as claimed in claim 2, wherein the number defining the assumed initial state of the counting module (CTM) is a negative number (M) having an absolute value which is a highest integer number less than or equal to the number defined as a ratio of a fourth part of the period (T) of the square wave (z(t)) obtained for the analog signal (x(t)) whose value is constant in time and equal to zero to the period ($T_0$) of the reference clock (RG).

5. Method as claimed in claim 2, wherein the number defining the assumed initial state of the counting module (CTM) is a negative number (M') having an absolute value which is a highest integer number less than or equal to a number defined as a difference between a ratio of the fourth part of the period (T) of the square wave (z(t)) obtained for the analog signal (x(t)) whose value is constant in time and equal to zero to the period ($T_0$) of the reference clock (RG), and a number (m) of ticks of the reference clock (RG) in a time interval equal to a sum of a time needed to record the result of each counting in the intermediate buffer (TBUF) and a time needed to write the assumed initial state from a setup register (SR) to the counting module (CTM).

6. Method as claimed in claim 1, wherein the serial transmission is carried out via an output port (TxD) of the transmitting buffer (TDR) with a rate defined as a ratio of a number of bits of a given word obtained in the counting module (CTM), increased by a number of control bits to a half of the period (T) of the square wave (z(t)) determined for the analog signal (x(t)) whose value is constant in time and equal to zero.

7. Apparatus for analog-to-digital conversion with asynchronous Sigma-Delta modulation comprising an asynchronous Sigma-Delta modulator and a counting module connected to a reference clock,
wherein the counting module (CTM) has an output connected to an intermediate buffer (TBUF) having an output connected to a transmitting buffer (TDR), the transmitting buffer having an output which is at the same time the output of the apparatus for analog-to-digital conversion, while an input programming an initial state of the counting module (CTM) is connected to a setup register (SR), and a counting input of the counting module (CTM) is connected to an output of the reference clock (RG), and an output of the reference clock (RG) and the output of the asynchronous Sigma-Delta modulator (ASDM) are connected to separate inputs of the control module (CM) having outputs which are connected to the counting module (CTM), the intermediate buffer (TBUF) and the transmitting buffer (TDR) respectively.

8. Apparatus as claimed in claim 7, wherein the counting module (CTM) comprises one counter (CT) having an input programming an initial state connected directly to the setup register (SR), and a counting input connected directly to the output of the reference clock (RG), and
wherein an output of the counter (CT) is connected directly to the intermediate buffer (TBUF), and an input of the counter (CT), that controls the writing of the initial state to thereto, is connected to an output of the control module (CM).

9. Apparatus as claimed in claim 7, wherein the counting module (CTM) comprises two counters (CT1, CT2) having inputs programming their initial states which are connected to the setup register (SR), and the counting inputs are connected via switches (S1, S2) to the output of the reference clock (RG), and a control input of one of said switches (S1) is connected directly to the output of the asynchronous Sigma-Delta modulator (ASDM), and a control input of the other of said switches (S2) is connected via an inverter (IN) to the output of the asynchronous Sigma-Delta modulator (ASDM) to which the input of the control module (CM) is coupled at the same time, and
wherein the output of the counting module (CTM) connected to the intermediate buffer (TBUF) is the output of a multiplexer (MP) having inputs which are connected to the outputs of the counters (CT1, CT2) respectively, and the multiplexer (MP) is coupled to an additional output of the control module (CM), while separate outputs of the control module (CM) are connected to inputs that control the writing of the initial states to the counters (CT1, CT2).

* * * * *